(12) United States Patent
Kawai et al.

(10) Patent No.: US 11,045,893 B2
(45) Date of Patent: Jun. 29, 2021

(54) POWER SUPPLY SYSTEM, POWER SUPPLY DEVICE, AND CONTROL METHOD

(71) Applicant: DAIHEN Corporation, Osaka (JP)

(72) Inventors: Hirokazu Kawai, Osaka (JP); Songjie Hou, Osaka (JP); Hideo Shiozaki, Osaka (JP); Haruhiko Manabe, Osaka (JP); Satoru Hata, Osaka (JP); Hiroyasu Mondori, Osaka (JP); Kazuki Yoshida, Osaka (JP)

(73) Assignee: DAIHEN Corporation, Osaka (JP)

( * ) Notice: Subject to any disclaimer, the term of this patent is extended or adjusted under 35 U.S.C. 154(b) by 400 days.

(21) Appl. No.: 16/097,099

(22) PCT Filed: May 23, 2017

(86) PCT No.: PCT/JP2017/019098
§ 371 (c)(1),
(2) Date: Oct. 26, 2018

(87) PCT Pub. No.: WO2017/221610
PCT Pub. Date: Dec. 28, 2017

(65) Prior Publication Data
US 2019/0105724 A1   Apr. 11, 2019

(30) Foreign Application Priority Data

Jun. 23, 2016 (JP) ................................. 2016-124869

(51) Int. Cl.
*B23K 9/10* (2006.01)
*H02M 3/28* (2006.01)
(Continued)

(52) U.S. Cl.
CPC ...... *B23K 9/1075* (2013.01); *G01R 19/16528* (2013.01); *H02M 3/28* (2013.01); *H02M 3/33515* (2013.01); *B23K 9/1062* (2013.01)

(58) Field of Classification Search
CPC .. B23K 9/0956; B23K 9/1062; B23K 9/1075; B23K 9/0731; B23K 9/0734;
(Continued)

(56) References Cited

U.S. PATENT DOCUMENTS 4,595,820 A * 6/1986 Richardson .......... B23K 9/0956
219/130.01
5,061,841 A * 10/1991 Richardson .......... B23K 9/0956
219/130.01
(Continued)

FOREIGN PATENT DOCUMENTS

CN        1139308 A      1/1997
CN      105580261 A      5/2016
(Continued)

OTHER PUBLICATIONS

CN translation (Year: 2021).*
(Continued)

*Primary Examiner* — Ibrahime A Abraham
*Assistant Examiner* — Frederick F Calvetti
(74) *Attorney, Agent, or Firm* — Rudy J. Ng; Bret E. Field; Bozicevic, Field & Francis LLP

(57) ABSTRACT

A power supply system includes multiple power supply devices including a first power supply device and a second power supply device that are connected in common to a load. The first power supply device calculates control information for controlling voltage or current to be output to the load and controls the output to the load based on the calculated control information while transmitting the control information to the second power supply device. The second power supply device receives the control information and controls the output to the load based on the received control information while detecting current to be output from its own device to the load and transmitting current information (Continued)

to the first power supply device. The first power supply device receives the current information transmitted from the second power supply device and calculates control information based on the received current information and the current and voltage detected by its own device.

7 Claims, 8 Drawing Sheets

(51) Int. Cl.
    *G01R 19/165*     (2006.01)
    *H02M 3/335*     (2006.01)
(58) Field of Classification Search
    CPC .......... G01R 19/16528; H02M 3/1584; H02M 3/28; H02M 3/285; H02M 3/3351; B32K 9/0732
    See application file for complete search history.

(56) References Cited

U.S. PATENT DOCUMENTS

| | | | |
|---|---|---|---|
| 5,796,601 A | 8/1998 | Yamamoto | |
| 6,291,798 B1 | 9/2001 | Stava | |
| 7,479,772 B2* | 1/2009 | Zane | H02J 1/106 323/272 |
| 8,008,901 B2* | 8/2011 | Tang | H02M 3/158 323/282 |
| 8,330,438 B2* | 12/2012 | Sreenivas | H02M 3/1588 323/272 |
| 8,653,412 B2* | 2/2014 | Inada | B23K 9/0956 219/130.01 |
| 9,236,800 B2* | 1/2016 | Tang | H02M 3/158 |
| 9,960,676 B1* | 5/2018 | Symonds | H02M 3/285 |
| 10,610,947 B2* | 4/2020 | Kawai | H02M 3/28 |
| 2005/0023253 A1 | 2/2005 | Houston et al. | |
| 2005/0051524 A1* | 3/2005 | Blankenship | B23K 9/1062 219/130.51 |
| 2006/0203524 A1 | 9/2006 | Ohno et al. | |
| 2006/0239046 A1* | 10/2006 | Zane | H02M 3/1584 363/65 |
| 2011/0108536 A1* | 5/2011 | Inada | B23K 9/127 219/130.1 |
| 2011/0309054 A1* | 12/2011 | Salsich | B23K 9/133 219/108 |
| 2013/0141952 A1 | 6/2013 | Kaneko | |
| 2015/0061392 A1* | 3/2015 | Berard | G05F 1/625 307/52 |
| 2015/0229225 A1* | 8/2015 | Jang | H02M 3/33569 363/17 |

FOREIGN PATENT DOCUMENTS

| | | |
|---|---|---|
| EP | 2752983 A1 | 7/2014 |
| JP | 2001-037217 A | 2/2001 |
| JP | 2001-129667 A | 5/2001 |
| JP | 3259308 B2 | 2/2002 |
| JP | 2005-130599 A | 5/2005 |
| JP | 2006-116556 A | 5/2006 |
| JP | 2006-254669 A | 9/2006 |
| JP | 2009-148032 A | 7/2009 |
| JP | 2013-038864 A | 2/2013 |
| JP | 2016-208742 A | 12/2016 |

OTHER PUBLICATIONS

JP translation (Year: 2021).*
English Translation of International Search Report for PCT/JP2017/019098 dated Jun. 27, 2017, 1 page.
Extended European Search Report for European Application No. 17815079.3 dated Feb. 10, 2020, 8 pages.
English Translation of International Search Report for PCT Application No. PCT/JP2018/015765 dated Jun. 12, 2018, 1 page.
Extended European Search Report for European Application No. 188283873 dated Feb. 1, 2021, 11 pages.

* cited by examiner

F I G . 1
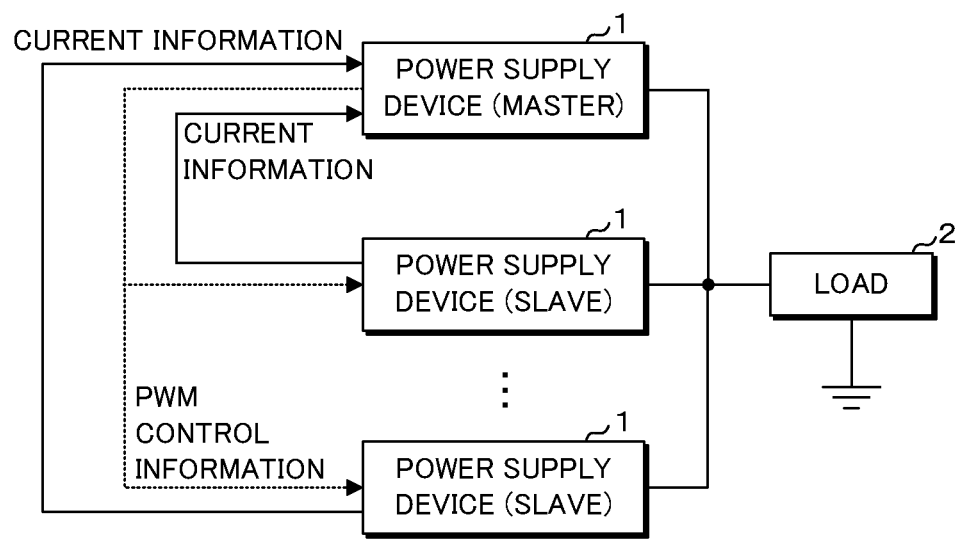

POWER SUPPLY SYSTEM, POWER SUPPLY DEVICE, AND CONTROL METHOD

CROSS-REFERENCE TO RELATED APPLICATIONS

This application is the national phase under 35 U. S. C. § 371 of PCT International Application No. PCT/JP2017/019098 which has an International filing date of May 23, 2017 and designated the United States of America.

FIELD

The present invention relates to a power supply system including multiple power supply devices that are connected in parallel to a common load, a power supply device constituting the power supply system, a control method and a control program.

BACKGROUND

Some machineries such as an arc welding machine, an arc cutting machine and so on require large current over 500-1000 amperes. Japanese Patent Application Laid-Open No. 2001-129667 discloses power supplies each including a switching converter circuit to perform AC/DC conversion of commercial alternating current and being capable of outputting large current to an arc welding machine. The operation of the switching converter circuits is controlled by a single controller, which enables formation of a single power supply as a whole. The controller detects current output and collected from the switching converter circuits and performs PWM control on the switching converter circuits such that the detected current matches target current.

Since in the power supply according to Japanese Patent Application Laid-Open No. 2001-129667, the switching converter circuits operate according to a PWM signal output from the single controller, the switching circuits are synchronized with each other in operation, which provides the power supply with high response.

Meanwhile, connecting in parallel multiple existing power supplies to a common load and supplying current from the power supplies to the load have also been conceived. Japanese Patent Application Laid-Open No. 2009-148032, for example, discloses a parallel power supply system including multiple power units that are connected in parallel to a common load and whose communication ports are connected with each other by a communication line.

The power units send and receive output current values as balance information to and from each other and determine target voltage value based on the balance information to thereby control the output.

SUMMARY

However, in the power supply according to Japanese Patent Application Laid-Open No. 2001-129667, when variations occur in power cables connected to the switching converter circuits, electric resistances inside the circuit and the like this causes differences in current output from the switching converter circuits. If variations occur in the output current from the switching converter circuits, variations in temperature within the circuits occur, and the lives of the switching converter circuits are different from one converter circuit to another. The power supply that is configured to output large current by a single device presents various problems such as a necessity of heat resistant design to be resistant to long hours of operation, a safety design and so on, and such a power supply is generally expensive.

Meanwhile, the power units according to Japanese Patent Application Laid-Open No. 2009-148032 perform balance control such that the current output from the units are equalized, but the power units which are basically individually operate are so controlled that output current is coincident with the target current on which balance correction have been performed. Thus, the power units are not synchronized with each other in their operation, which causes a problem of instability in current supplied from the power units to the load. In a welding power source, for example, a welding load widely varying from a short circuit load through an arc load to no load during a very short time period has problems such as low response of the power units and instability of the total current supplied from the power units to the load.

Also conceivable are monitoring with an external control device current or the like output from the power units connected in parallel to the load and correcting the operation of the power units. This causes a problem of the cost of equipment required for introducing the external control device. The power units continue to operate independently, which causes a problem of lack of stability of current output to the load.

It is an object to provide a power supply system including multiple power supply devices connected in parallel to a common load and capable of performing stable control such that current to be output from the power supply devices to the load is equalized without introducing an external control device, a power supply device constituting the power supply system, a control method and a control program.

A power supply system according to an aspect of the present disclosure is a power supply system comprising a plurality of power supply devices including a first power supply device and a second power supply device connected in parallel to a common load. The first power supply device out of the power supply devices comprises a control information calculation unit that calculates control information for controlling voltage or current to be output to the load, a control unit that controls voltage or current to be output to the load based on the control information calculated by the control information calculation unit, and a control information transmission unit that transmits the control information calculated by the control information calculation unit to a second power supply device. The second power supply device comprises a control information reception unit that receives control information transmitted from the first power supply device, a control unit that controls voltage or current to be output to the load based on the control information received by the control information reception unit, a current detection unit that detects current output from the second power supply device to the load, and a current information transmission unit that transmits current information indicative of the current detected by the current detection unit to the first power supply device. The first power supply device further comprises a current information reception unit that receives current information transmitted from the second power supply device, a current detection unit that detects current output from the first power supply device to the load and a voltage detection unit that detects voltage output from the first power supply device to the load. The control information calculation unit comprises a calculation unit that calculates control information for controlling voltage or current to be output to the load based on the current indicated by the current information received by the current information reception unit, the current detected by the current detection unit included in the first power supply device and the voltage detected by the voltage detection unit, a first correction unit that corrects the control information concerning the first power supply device such that current to be output from the first power supply device to the load and current to be output from the second power supply device to the load are equalized based on the current indicated by the current information received by the current information reception unit and the current detected by the current detection unit included in the first power supply device, and a second correction unit that corrects the control information concerning the second power supply device such that current to be output from the first power supply device to the load and current to be output from the second power supply device to the load are equalized based on the current indicated by the current information received by the current information reception unit and the current detected by the current detection unit included in the first power supply device.

According to the present disclosure, the first power supply device and the second power supply device connected in parallel to a common load mutually communicate with each other, and the first power supply device controls the output of the overall power supply system. Accordingly, the power supply devices are synchronized with each other in their operation, and achieves high response to fluctuations in load. Thus, stable control of current output from the power supply devices to the load is made possible.

More specifically, the first power supply device calculates control information for controlling the output to the load. The first power supply device then controls the output from its own device based on the control information obtained by calculation and transmits the control information to the second power supply device. The second power supply device receives the control information transmitted from the first power supply device without calculating the control information for controlling the output, and controls the output from its own device based on the control information calculated by the first power supply device. The second power supply device then detects the current output from its own device to the load and transmits the current information to the first power supply device.

The first power supply device receives the current information transmitted from the second power supply device and calculates control information based on the current indicated by the received current information and the current and voltage detected by its own device. The control information calculated here is information that is calculated based on the current and voltage output from the first power supply device and the second power supply device, and is capable of performing control of the output from the overall power supply system and further performing control such that the current output from the power supply devices do not vary from each other.

More specifically, the calculation unit calculates control information for controlling voltage or current to be output to the load from the first power supply device and the second power supply device assuming that the electric characteristics of the respective power supply devices are the same. However, due to variations in electric resistances of the power cables connecting the power supply devices and loads, variations in resistance inside the power supply devices, variations in connected electric resistance and so on, current actually output from the power supply devices to the load varies from each other. When variations in current occur, variations in temperatures of the power supply devices under operation also occur, which differentiates the lives of the power supply devices connected in parallel.

Hereupon, the first correction unit corrects the control information for controlling the first power supply device so as to reduce variation in current. Likewise, the second correction unit corrects the control information for controlling the second power supply device so as to reduce variation in current.

Accordingly, it is possible to reduce the variation between the current output from the first power supply device and the current output from the second power supply device.

Furthermore, by correcting the control information of the first power supply device and the second power supply device in the same manner, the influence on the total sum of the current output from the first power supply device to the load and the current output from the second power supply device to the load may be reduced to a minimum, and each of the control information may be corrected. Note that even if correction is made so as to vary the total sum of the current, the calculation unit calculates the control information such that the total sum of the current takes a required value, so that the current output to the load is not changed by the correction of the control information.

Since the first power supply device and the second power supply device control the outputs based on the control information thus calculated and corrected, current output from the power supply devices to the load is uniform, and variations in current do not occur, which allows for stable balance control of the output current.

The power supply system according to another aspect of the present disclosure further comprises: a difference calculation unit that calculates a difference between the current indicated by the current information received by the current information reception unit and the current detected by the current detection unit included in the first power supply device; and a comparison unit that compares the difference calculated by the difference calculation unit and a threshold. The first correction unit and the second correction unit correct the control information calculated by the calculation unit if the difference is equal to or more than the threshold.

According to the present disclosure, if the difference between the current output from the first power supply device and the current output from the second power supply device, that is, a variation in current is equal to or more than a threshold, the control information is corrected while if the variation in current is less than the threshold, the control information is not corrected.

Accordingly, only when the variation in current of the power supply devices are significant, the control information may be corrected, so that stable balance control of the output current is made possible.

The power supply system according to another aspect of the present disclosure further comprises: a difference calculation unit that calculates a difference between the current indicated by the current information received by the current information reception unit and the current detected by the current detection unit included in the first power supply device; and an upper limit comparison unit that compares the difference calculated by the difference calculation unit and an upper limit threshold. The control unit of one of the power supply devices stops operation of the one of the power supply devices if the difference is equal to or more than the upper limit threshold.

According to the present disclosure, if the difference between the current output from the first power supply device and the current output from the second power supply device, that is, the variation in current is equal to or more than a predetermined upper limit threshold, each of the power supply devices stops the operation of its own device regarding that abnormality occurs in this power supply device.

For example, in a situation where a power cable is not connected to one of the power supply devices, only the other one of the power supply devices intends to achieve target current or target voltage, which results in an output of very high load and may cause the power supply device to fail. In such a case, each of the power supply devices according to the present disclosure stops its operation. Accordingly, in the case where abnormality occurs in the current output from each of the power supply devices, the overall power supply system may be stopped to thereby ensure safety. Additionally, the power supply system may be maintained.

In the power supply system according to another aspect of the present disclosure, the control information calculated by the calculation unit includes a control value to increase or reduce current to be output to the load, the first correction unit corrects the control information by multiplying the control value included in the control information by a correction coefficient represented by a formula (1) below, and the second correction unit corrects the control information by multiplying the control value included in the control information by a correction coefficient represented by a formula (2) below $$P1=1+G\times(I2-I1)/(I1+I2) \quad (1)$$

$$P2=1+G\times(I1-I2)/(I1+I2) \quad (2),$$

where P1 and P2 represent correction coefficients, I1 represents current detected by the first power supply device, I2 represents current detected by the second power supply device, and G represents a constant.

According to the present disclosure, the control information includes a control value to increase or reduce the current to be output to the load. The control value is a duty ratio of a PWM signal, for example. The first correction unit and the second correction unit may correct the control information such that variations in current output from the power supply devices is made small by multiplying the correction values represented by the formulas (1) and (2) by the control values.

In the power supply system according to another aspect of the present disclosure, the plurality of power supply devices supply power to a load concerning arc welding.

According to the present disclosure, the power supply system may supply large current to the load concerning arc welding.

The power supply device according to another aspect of the present disclosure is a power supply device outputting voltage and current to a load, and comprises a current detection unit that detects current output to the load; a voltage detection unit that detects voltage output to the load; a current information reception unit that receives current information indicative of current output from a different power supply device to the load; a calculation unit that calculates control information for controlling voltage or current to be output to the load based on the current indicated by the current information received by the current information reception unit, the current detected by the current detection unit and the voltage detected by the voltage detection unit; a first correction unit that corrects the control information concerning the power supply device such that current output from the power supply device to the load and the current output from the different power supply device to the load are equalized based on the current indicated by the current information received by the current information reception unit and the current detected by the current detection unit; a second correction unit that corrects the control information concerning the different power supply device such that current output from the power device and the current output from the different power supply device to the load are equalized based on the current indicated by the current information received by the current information reception unit and the current detected by the current detection unit; a control unit that controls voltage or current to be output to the load based on the control information corrected by the first correction unit; and a control information transmission unit that transmits the control information corrected by the second correction unit to the different power supply device.

According to the present disclosure, similarly to the aspect (1), the output from the overall power supply system may be controlled. In addition, the control information capable of performing control so as not to cause variations in the current output from the power supply devices is calculated and corrected, whereby the operation of the power supply device and the different power supply device may be controlled. Accordingly, stable balance control of the output current is made possible.

A control method according to another aspect of the present disclosure is a control method of a power supply system comprising a plurality of power supply devices including a first power supply device and a second power supply device, the plurality of power supply devices being to be connected in parallel to a common load. The control method comprises detecting current output from the first power supply device to the load and current output from the second power supply device to the load, and voltage output from the first power supply device to the load; calculating control information for controlling voltage or current to be output to the load from each of the power supply devices based on each detected current and the detected voltage; correcting control information concerning the first power supply device and control information concerning the second power supply device such that current to be output from the first power supply device to the load and current to be output from the second power supply device to the load are equalized based on each detected current; and controlling voltage or current to be output from the first power supply device and the second power supply device to the load based on the corrected control information.

According to the present disclosure, similarly to the aspect (1), the output from the overall power supply system may be controlled. In addition, the control information capable of performing control so as not to cause variations in the current output from the power supply devices is calculated and corrected, whereby the operation of the power supply device and the different power supply device may be controlled. Accordingly, stable balance control of the output current is made possible.

A control program according to another aspect of the present disclosure is a control program causing a computer to control operation of a power supply device outputting voltage and current to a load. The control program causes the computer to execute processing of obtaining current output to the load; obtaining voltage output to the load; obtaining current information indicative of current output from a different power supply device to the load; calculating control information for controlling voltage or current to be output to the load by the power supply devices based on each obtained current and obtained voltage; correcting the control information concerning the power supply device and the control information concerning the different power supply device such that current to be output from the power supply devices to the load is equalized based on each obtained current; controlling voltage or current to be output from the power supply device to the load based on corrected control information; and transmitting the corrected control information to the different power supply device.

According to the present disclosure, similarly to the aspect (1), it is possible to cause the computer to control the overall output of the power supply system, to calculate and correct the control information so as not to cause variations in current output from the power supply devices and to control the operation of its own power supply device and the different power supply device. Accordingly, stable balance control of the output current is made possible.

According to the present disclosure, in a power supply system including multiple power supply devices connected in parallel to a common load, it is possible to perform stable control such that current to be output from the power supply devices to the load is equalized without introducing an external control device.

The above and further objects and features will more fully be apparent from the following detailed description with accompanying drawings.

BRIEF DESCRIPTION OF THE DRAWINGS

FIG. 1 is a block diagram illustrating one example of the configuration of a power supply system according to an embodiment.

DETAILED DESCRIPTION

Figure 2:
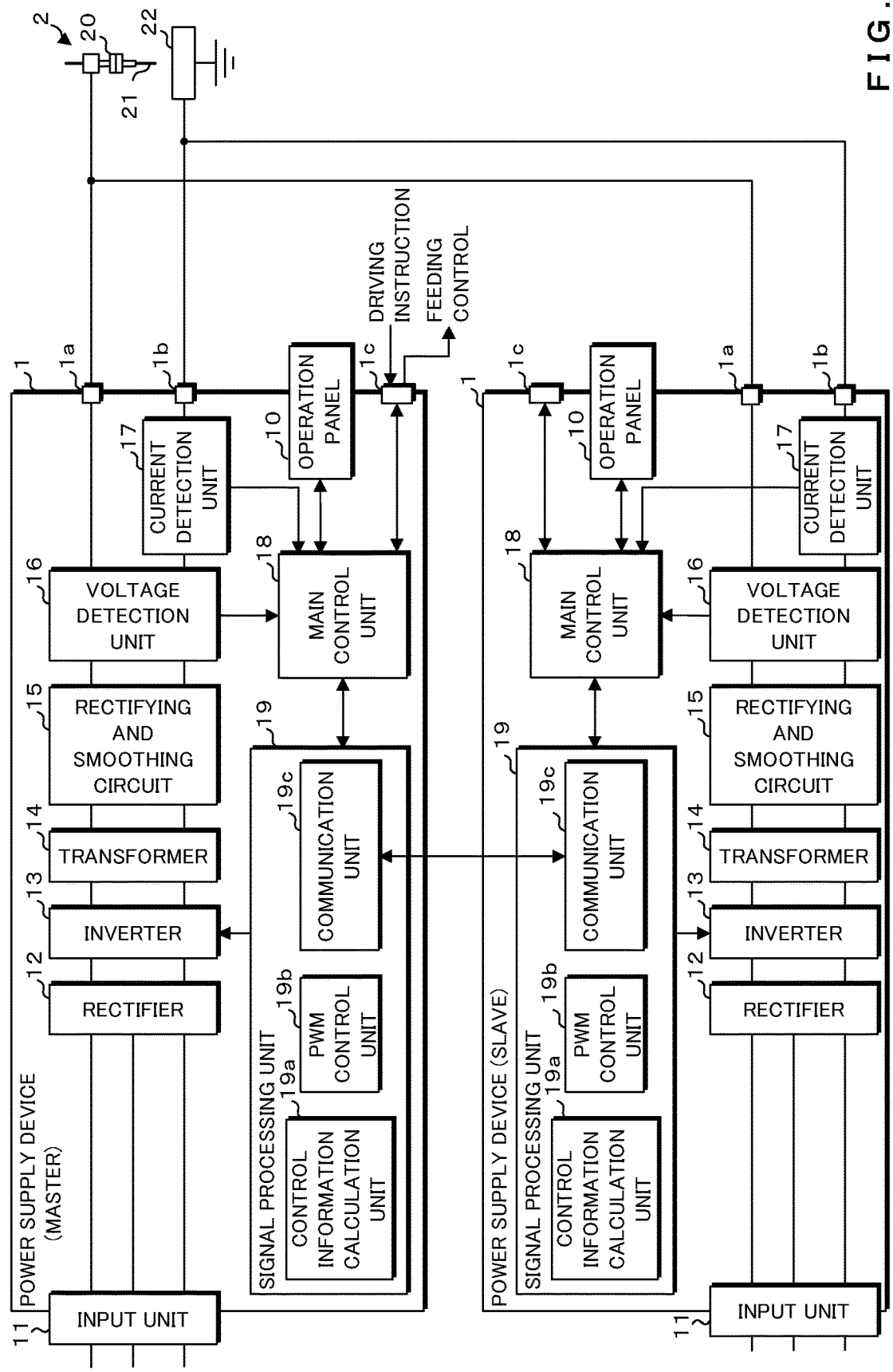
FIG. 2 is a block diagram illustrating one example of the configuration of power supply devices.

The present disclosure will be described below with reference to the drawings depicting embodiments thereof.

FIG. 1 is a block diagram illustrating one example of the configuration of a power supply system according to the present embodiment. The power supply system according to the present embodiment includes multiple power supply devices 1 that are connected in parallel to a common load 2 concerning arc welding and that supply power to the load 2. The power supply devices 1 are connected to each other through a communication line. The multiple power supply devices 1 each are an isolated switching power supply and convert alternating current (AC) to required direct current (DC) and supplies the DC having been subjected to the AC/DC conversion to the load 2.

One power supply device 1 out of the multiple power supply devices 1 functions as a master power supply that controls the output of the power supply devices 1 by transmitting PWM control information to another power supply device 1 through a communication line. Another power supply device 1 functions as a slave power supply that receives the PWM control information transmitted from the one power supply device 1 and controls the output based on the received PWM control information. Hereafter, the power supply device 1 functioning as the master power supply is appropriately referred to as a first power supply device 1 while the power supply device 1 functioning as the slave power supply is appropriately referred to as a second power supply device 1. One or more of the second power supply devices 1 may be provided.

The second power supply device 1 detects current to be output from its own device to the load 2 and transmits current information indicative of the detected current to the first power supply device 1 through the communication line. The first power supply device 1 receives the current information transmitted from the second power supply device 1 and adds the current indicated by the current information and the current detected by its own device to thereby calculate the total current to be output from the power supply system to the load 2. The first power supply device 1 then detects voltage output to the load 2 from its own device and calculates PWM control information for controlling the output from the power supply devices 1 constituting the power supply system based on the voltage obtained by detection and the total current. Furthermore, the first power supply device 1 appropriately corrects the PWM control information in order to avoid variations in current output from the power supply devices 1 to the load 2. The first power supply device 1 controls the output from its own device based on the PWM control information thus calculated and corrected, and controls the operation of another power supply device 1 by transmitting the PWM control information to the second power supply device 1 as described above.

Note that each of the power supply devices 1 may function as either one of the master power supply and the slave power supply by switching the operation mode. Furthermore, by switching the operation mode, each of the power supply devices 1 may also function as a single independent power supply device 1.

FIG. 2 is a block diagram illustrating one example of the configuration of the power supply device 1. Hereafter, in the interest of simplicity, description will be made assuming that the power supply system is formed by two power supply devices 1 including the first power supply device 1 and the second power supply device 1. The first power supply device 1 and the second power supply device 1 are the same in configuration, and thus the configuration of one of the power supply devices 1 will mainly be described.

The power supply device 1 is provided with an operation panel 10, an input unit 11, a rectifier 12, an inverter 13, a transformer 14, a rectifying and smoothing circuit 15, a voltage detection unit 16, a current detection unit 17, a main control unit 18 and a signal processing unit 19.

The input unit 11 is an input terminal connected to a three-phase alternating current power supply (not illustrated), for example. The input unit 11 is connected to the rectifier 12, and inputs three-phase alternating current applied to the input terminal thereof to the rectifier 12.

The rectifier 12 is a diode bridge circuit, for example. The diode bridge has a circuit configuration having parallel-connected three series circuits each consisting of two forward-connected diodes (not illustrated). Across the output terminal of the diode bridge circuit, a smoothing capacitor (not illustrated) is provided. The rectifier 12 applies a full-wave rectification to the AC input from the three-phase alternating current power supply via the input unit 11 and outputs DC having been smoothed by the smoothing capacitor to the inverter 13.

The inverter 13 is a circuit for converting the DC having been rectified and smoothed by the rectifier 12 into AC of high frequency and outputting the resultant to the transformer 14. The inverter 13 is a full bridge circuit formed by four switching elements, for example. The full bridge circuit has a circuit configuration in which two legs each including two switching elements connected in series are connected in parallel. Each switching element is a power device such as an insulated gate bipolar transistor (IGBT), a metal-oxide-semiconductor field effect transistor (MOSFET) or the like.

The transformer 14 transforms the AC output from the inverter 13 and outputs the transformed AC to the rectifying and smoothing circuit 15. The transformer 14 has a primary coil and a secondary coil each of which is wound around the core and that are magnetically coupled to each other. The primary coil is connected to the inverter 13 while the secondary coil is connected to the rectifying and smoothing circuit 15.

The rectifying and smoothing circuit 15 is a circuit for rectifying and smoothing the AC output from the transformer 14, and the rectified DC voltage and current are respectively output from a positive output terminal 1a and a negative output terminal 1b to the load 2. The rectifying and smoothing circuit 15 is formed by, for example, a full-wave rectifying circuit using a center tap, a smoothing circuit using a reactor or the like.

The load 2 is related to arc welding, for example, and includes a welding wire 21, a base metal 22, an arc generated by ionized shielding gas and so on. The positive output terminal 1a is electrically connected to the welding wire 21 through a positive-side power cable and a welding torch 20 while the negative output terminal 1b is connected to the base metal 22 through a negative-side power cable.

The voltage detection unit 16 is connected to the output side of the rectifying and smoothing circuit 15, for example, and is a circuit for detecting voltage to be output from its own device to the load 2 and outputting a voltage value signal indicating the detected voltage value to the main control unit 18.

The current detection unit 17 is provided on the output side of the rectifying and smoothing circuit 15, for example, and is a circuit for detecting current to be output to the load 2 from its own device and outputting a current value signal indicating the detected current value to the main control unit 18. The current detection unit 17 is, for example, a hall-typed current sensor provided with a magnetoelectric conversion element such as a hall element or the like.

The main control unit 18 that includes a central processing unit (CPU), a read-only memory (ROM), a random-access memory (RAM), an interface and so on is a processor for controlling the overall operation of the power supply device 1. The main control unit 18 is connected to a control terminal 1c at its interface. The control terminal 1c of the power supply device 1 functioning as a master power supply is connected to a control communication line of the welding machine, to which a driving instruction signal output from the welding machine is to be input. The main control unit 18 monitors the input state of a driving instruction signal, and outputs to the signal processing unit 19 a driving request for operating the inverter 13 if a driving instruction signal is input. Note that no driving instruction signal is input to the control terminal 1c of the power supply device 1 functioning as a slave power supply.

Furthermore, the main control unit 18 is connected, at its interfaces, to the voltage detection unit 16 and the current detection unit 17 from which a voltage value signal and a current value signal are input respectively. The main control unit 18 performs AD conversion on the input voltage value signal and current value signal and outputs voltage information and current information obtained by the AD conversion to the signal processing unit 19.

Moreover, the main control unit 18 is connected to the operation panel 10 and receives an input of a signal according to an operation performed on the operation panel 10. The main control unit 18 accepts an operation performed on the operation panel 10 by monitoring the signal. The main control unit 18 according to the present embodiment may accept selection of an operating mode of the power supply device 1 via the operation panel 10. The operation mode includes a master power supply mode (first control mode) that causes the power supply device 1 to function as a master power supply, a slave power supply mode that causes the power supply device 1 to function as a slave power supply (second control mode) and a single power supply mode that causes the power supply device 1 to function as a single power supply. Furthermore, the main control unit 18 causes the operation panel 10 to display an operating state of its own device by outputting to the operation panel 10 a display instruction signal for displaying various operating states such as an operating mode, output voltage, output current and the like of its own device.

In addition, the main control unit 18 of the power supply device 1 operating as a master power supply outputs a wire feeding control signal for controlling the feeding of the welding wire 21 in the welding machine from the control terminal 1c to the welding machine. It is noted that the power supply device 1 operating as a slave power supply does not output a wire feeding control signal.

The signal processing unit 19 is a digital signal processor (DSP) for outputting a PWM signal to switching elements constituting the inverter 13 and performing PWM control of turning ON and OFF of the switching elements, and includes a control information calculation unit 19a, a PWM control unit (control unit) 19b and a communication unit 19c. Furthermore, the signal processing unit 19 has a memory (not illustrated) for accumulating the information on the current detected by each power supply device 1. Note that the signal processing unit 19 may be formed by a field-programmable gate array (FPGA) or the like. The signal processing unit 19 is connected to the inverter 13 and the main control unit 18, and receives an input of voltage information, current information, a driving request and so on that are output from the main control unit 18. The signal processing unit 19 stores the operating mode of its own device, and the details of signal processing depend on the operating mode of the power supply device 1. The details of signal processing will be described later.

The control information calculation unit 19a is a functional part to calculate and correct PWM control information for controlling voltage or current to be output to the load 2 by controlling the operation of the inverter 13. The PWM control information is information indicative of a duty ratio (control value), a pulse waveform and the like of a PWM signal to be output to the inverter 13.

In the case where the operating mode is the single power supply mode, the control information calculation unit 19a calculates PWM control information for performing PWM control on the inverter 13 of its own device based on the voltage information and current information output from the main control unit 18, that is, the voltage and current detected by its own device.

In the case where the operating mode is the master power supply mode, the control information calculation unit 19a calculates PWM control information for performing PWM control on the inverters 13 of the first power supply device 1 and the second power supply device 1 based on the voltage information and current information of its own device output from the main control unit 18 and the current information concerning another power supply device 1. That is, the control information calculation unit 19a calculates PWM control information based on the voltage and current detected by its own device and the current detected by another power supply device 1 serving as a slave power supply. Furthermore, the control information calculation unit 19a appropriately corrects the PWM control information such that a variation in current output from the first and second power supply devices 1 is less than a predetermined threshold. Note that the current information detected by another power supply device 1 may be received by the communication unit 19c.

In the case where the operating mode is the slave power supply mode, the control information calculation unit 19a does not calculate PWM control information.

The PWM control unit 19b is a functional part for generating a PWM signal having a required duty ratio and a pulse waveform by using the PWM control information and outputting the generated signal to the inverter 13. The PWM control unit 19b alternately switches the switching elements of the full bridge circuit crosswise between ON and OFF to thereby output AC from the inverter 13.

In the case where the operating mode is the single power supply mode or the master power supply mode, the PWM control unit 19b generates a PWM signal by using the PWM control information calculated by the control information calculation unit 19a of its own device.

In the case where the operating mode is the slave power supply mode, the PWM control unit 19b generates a PWM control signal by using the PWM control information calculated by another power supply device 1. The PWM control information calculated by another power supply device 1 may be received by the communication unit 19c. If its own device and another power supply device 1 have the same output capacitance, the PWM signal of its own device and the PWM signal of another power supply device 1 are substantially the same as a result. If the output capacitances are different from each other, the PWM control unit 19b generates a PWM signal for which the difference between the output capacitances is corrected by using the PWM control information calculated by another power supply device 1. In this case, the PWM signal of its own device and the PWM signal of another power supply device 1 are different from each other.

The communication unit 19c is a communication circuit for transmitting and receiving various types of information to and from another power supply device 1. The communication unit 19c transmits and receives information according to the host control interface (HCI) communication standard, for example.

In the case where the operating mode is the master power supply mode, the signal processing unit 19 transmits operating information indicative of the operating state of the inverter 13 of its own device and PWM control information calculated and corrected by the control information calculation unit 19a to another power supply device 1 operating in the slave power supply mode via the communication unit 19c. The power supply device 1 serving as a slave power supply receives by the communication unit 19c the operating information and PWM control information that are transmitted from the power supply device 1 operating in the master power supply mode.

In the case where the operating mode is the slave power supply mode, the signal processing unit 19 transmits to the power supply device 1 operating in the master power supply mode via the communication unit 19c current information indicative of the current being output to the load 2 from its own device, operating information indicative of the operating state of the inverter 13 of its own device and abnormality information indicative of the presence or absence of abnormality of its own device. The abnormality information is information indicative of, for example, excessive current, abnormal stop or the like. The power supply device 1 serving as a master power supply receives the current information, the operating information and the abnormality information transmitted from the power supply device 1 operating in the slave power supply mode by the communication unit 19c.

Figure 3:
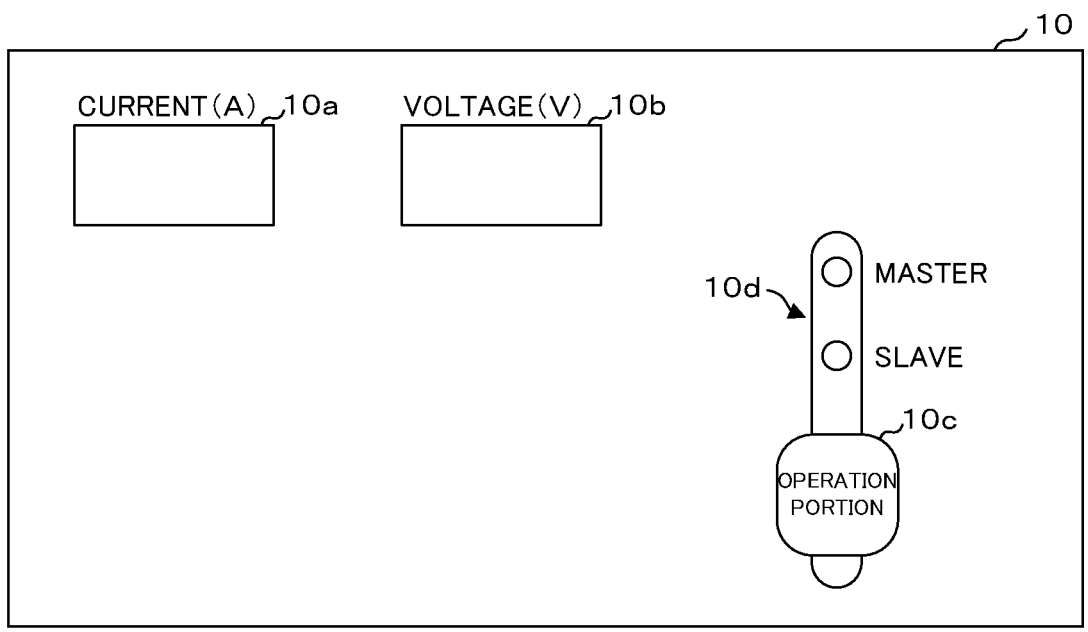
FIG. 3 is a schematic view illustrating one example of the configuration of an operation panel.

FIG. 3 is a schematic view illustrating one example of the configuration of the operation panel 10. The operation panel 10 includes a current display portion 10a and a voltage display portion 10b for displaying current and voltage that are being output to the load 2.

In the case where the operating mode is the master power supply mode, the main control unit 18 causes the current display portion 10a to display the value of the total sum of the current obtained by adding the current that is being output from the power supply devices 1. Furthermore, the main control unit 18 causes the voltage display portion 10b to display the value of the voltage obtained by detection in its own device (see FIG. 6A). In the case where the operating mode is the slave power supply mode, the main control unit 18 causes the current display portion 10a and the voltage display portion 10b to display predetermined information indicating that its own device is being driven (see FIG. 6B). The predetermined information is character information such as "DRIVING," "RUN" or the like, but the details of the information to be displayed is not limited to a specific one. Such a configuration may be included that display pixels or display segments constituting the current display portion 10a and the voltage display portion 10b are entirely lit up or put out. In the case where the operating mode is the single power supply mode, the main control unit 18 causes the current display unit 10a and the voltage display unit 10b to display the values of current and voltage that are being output from its own device.

Moreover, the operation panel 10 includes an operation portion 10c for switching the operating mode of the power supply device 1 and an operating mode display portion 10d for displaying the present operating mode of its own device. The operation portion 10c is, for example, a sealed tactile switch, a pushbutton switch or the like. The main control unit 18 of the power supply device 1 switches the present operating mode to another operating mode when the operation portion 10c is operated. For example, the signal processing unit 19 stores the present operating mode, and the main control unit 18 switches the operating mode of the signal processing unit 19 by outputting a mode switching instruction to the signal processing unit 19. The operating mode is switched among the single power supply mode, the master power supply mode, the slave power supply mode and the single power supply mode . . . in this order, for example, every time the operation portion 10c is operated.

The operating mode display portion 10d includes multiple light-emitting elements. The multiple light-emitting elements include a light-emitting element that lights up in the case of the master power supply mode and a light-emitting element that lights up in the case of the slave power supply mode, for example.

Figure 4:
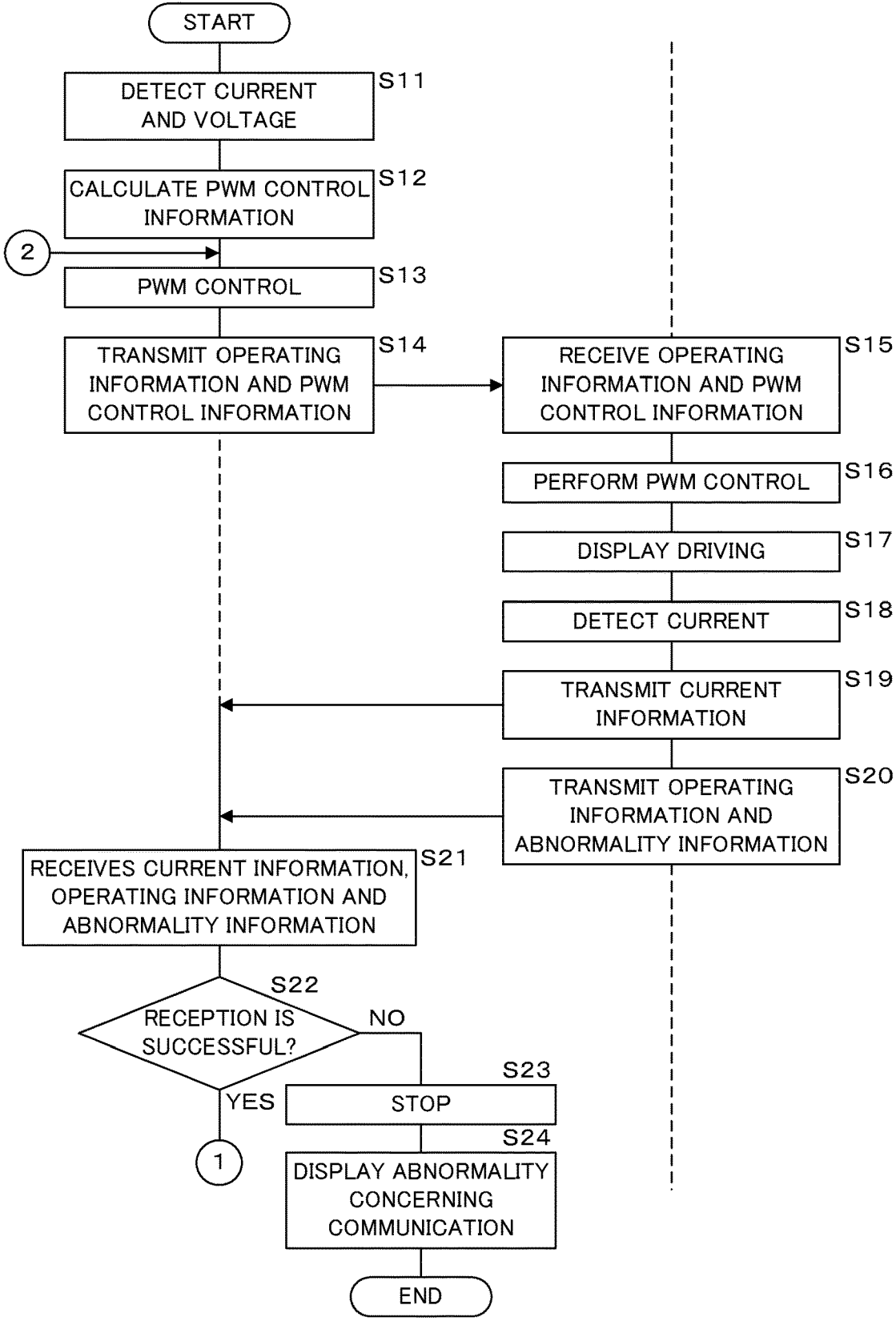
FIG. 4 is a flowchart illustrating the processing procedure of the power supply devices concerning power feeding control.
Figure 5:
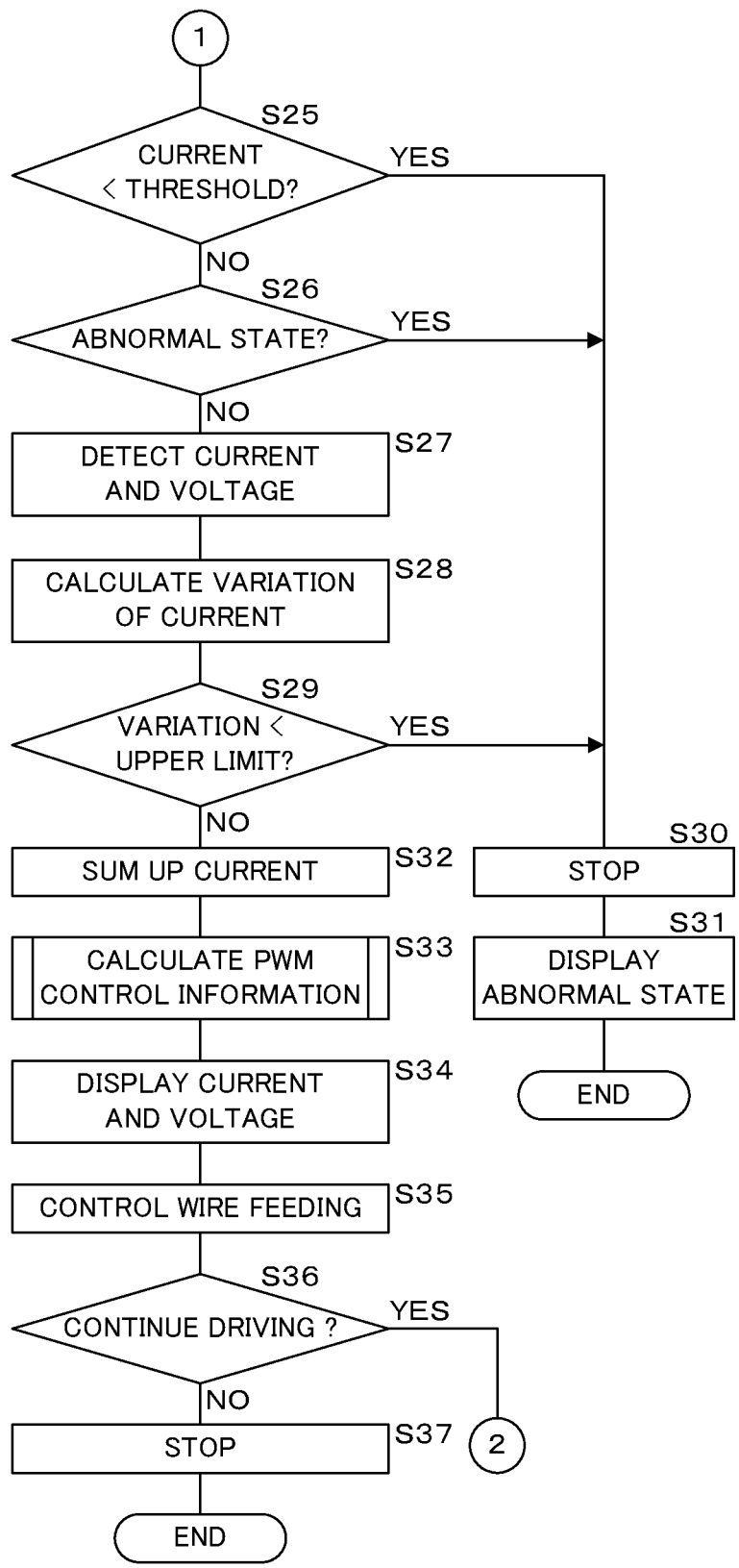
FIG. 5 is a flowchart illustrating the processing procedure of the power supply devices concerning power feeding control.
Figure 6A:
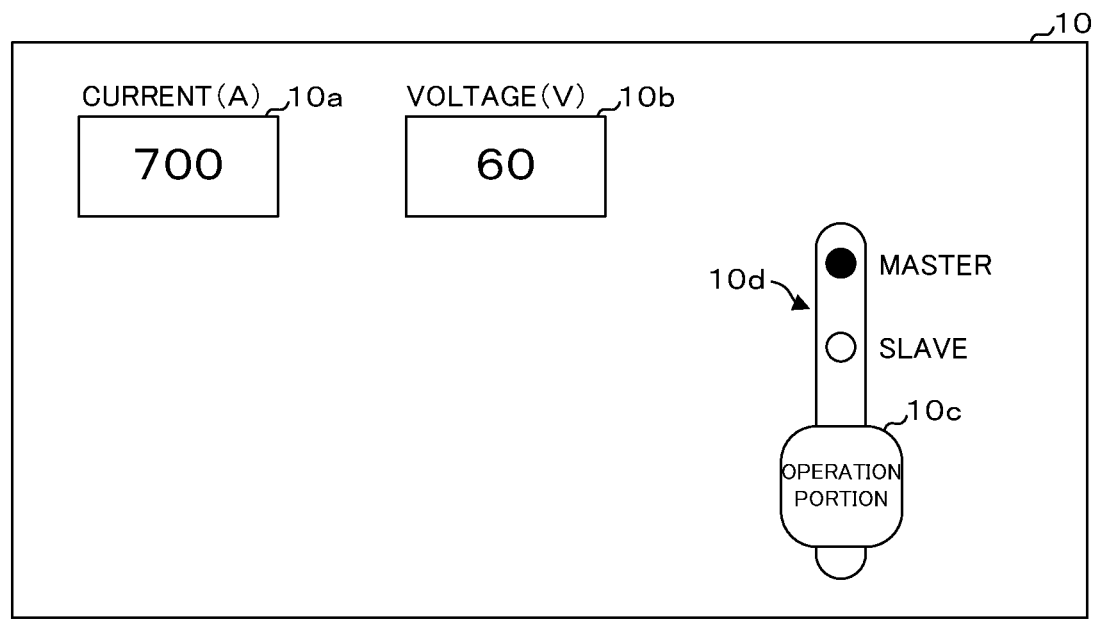
FIG. 6A is a schematic view illustrating a display example of an operating state.
Figure 6B:
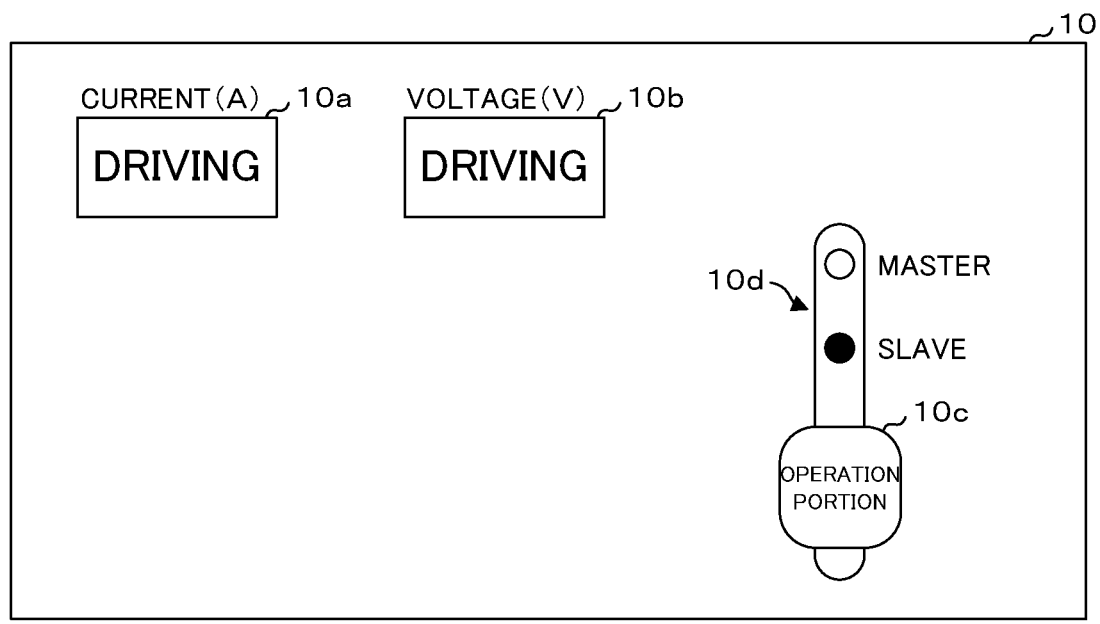
FIG. 6B is a schematic view illustrating a display example of an operating state.

FIG. 4 and FIG. 5 are flowcharts illustrating the processing procedure of the power supply devices 1 concerning power feeding control. FIG. 6A and FIG. 6B are schematic views illustrating display examples of the operating states. The processing of the first power supply device 1 operating in the master power supply mode and the second power supply device 1 operating in the slave power supply mode will be described here. Furthermore, FIG. 6A depicts the operation panel 10 of the power supply device 1 in the master power supply mode while FIG. 6B depicts the operation panel 10 of the power supply device 1 in the slave power supply mode.

In the case where a driving instruction signal is input to the first power supply device 1 serving as a master power supply, the main control unit 18 detects the current and voltage that are being output from its own device to the load 2 by the current detection unit 17 and the voltage detection unit 16, respectively (step S11). The main control unit 18 outputs the current information and voltage information obtained by detection to the signal processing unit 19.

The signal processing unit 19 in the master power supply mode calculates PWM control information based on the current and voltage indicated by the current information and the voltage information (step S12). Upon activation, the power supply device 1 serving as a slave power supply has not yet started its operation and thus calculates PWM control information using the current and voltage detected by the first power supply device 1, for example.

The signal processing unit 19 then performs PWM control on the inverter 13 based on the calculated PWM control information (step S13). Subsequently, the signal processing unit 19 transmits operating information indicating the operating state of the inverter 13 and the PWM control information to the second power supply device 1 serving as a slave power supply via the communication unit 19c (step S14). The operating information is, for example, information indicative of whether the inverter 13 is being driven or not.

The signal processing unit 19 in the slave power supply mode receives the operating information and PWM control information that are transmitted from the first power supply device 1 by the communication unit 19c (step S15). Next, the signal processing unit 19 in the slave power supply mode confirms that the master power supply is being driven based the operating information and performs PWM control on the inverter 13 of its own device based on the received PWM control information (step S16).

Note that the communication unit 19c that performs the transmission at step S14 corresponds to a control information transmission unit while the communication unit 19c that performs the reception at step S15 corresponds to a control information reception unit.

Subsequently, the main control unit 18 of the second power supply device 1 causes the operation panel 10 to display that it is being driven if its own device is normally operating (step S17). As illustrated in FIG. 6B, for example, the main control unit 18 causes the current display portion 10a and the voltage display portion 10b to display that its own device is being driven.

Next, the main control unit 18 of the second power supply device 1 detects current that is being output from its own device to the load 2 by the current detection unit 17 (step S18). The main control unit 18 outputs the current information obtained by detection to the signal processing unit 19.

The signal processing unit 19 in the slave power supply mode transmits the current information detected by its own device to the first power supply device 1 serving as a master power supply via the communication unit 19c (step S19). Furthermore, the signal processing unit 19 transmits operating information indicative of the operating state of the inverter 13 of its own device and abnormality information indicative of the presence or absence of abnormality to the first power supply device 1 via the communication unit 19c (step S20).

The signal processing unit 19 in the master power supply mode having transmitted the PWM control information or the like receives the current information, operating information and abnormality information that are transmitted from the second power supply device 1 (step S21) and determines whether or not receiving thereof is successful (step S22). The signal processing unit 19 stores the received current information and abnormality information. At least the current information is accumulated over a period of several milliseconds to several tens of milliseconds.

If determining that the reception is unsuccessful due to no response from the second power supply device 1 for a predetermined time period or longer (step S22: NO), the signal processing unit 19 stops the operation of the inverter 13 and the calculation of the PWM control information to thereby stop the output to the load 2 (step S23). Note that when the calculation of the PWM control information in the first power supply device 1 is stopped, the operation of the second power supply device 1 serving as a slave power supply is also stopped.

The signal processing unit 19 further notifies the main control unit 18 of communication abnormality, and the main control unit 18 causes the operation panel 10 to display the presence of abnormality concerning communication (step S24) and ends the processing.

It is noted that the communication abnormality occurs when the power supply device 1 to be operated as a slave power supply is erroneously operated in the master power supply mode as well as at a time of a disconnection of a communication line, faulty connection of a connector.

If determining that the reception of the current information, the operating information and the abnormality information is successful by receiving a response from the second power supply device 1 (step S22: YES), the signal processing unit 19 determines whether or not the current indicated by the received current information is less than a predetermined threshold (step S25).

If determining that the current is equal to or more than the threshold (step S25: NO), the signal processing unit 19 determines whether or not the state of the second power supply device 1 is abnormal based on the received abnormality information (step S26). For example, the signal processing unit 19 determines that abnormality occurs if the abnormality information indicates that the inverter 13 of the second power supply device 1 is in a stopped state or if the abnormality information indicates abnormality such as overcurrent or the like.

If determining that the second power supply device 1 normally operates (step S26: NO), the signal processing unit 19 detects the current and voltage that are being output from its own device to the load 2 by the current detection unit 17 and the voltage detection unit 16, respectively (step S27). More specifically, the main control unit 18 respectively detects by the current detection unit 17 and the voltage detection unit 16 the current and voltage that are being output from its own device to the load 2 and outputs the current information and voltage information obtained by detection to the signal processing unit 19. The signal processing unit 19 obtains the current information and voltage information that are output from the main control unit 18.

Note that the signal processing unit 19 stores the detected current and voltage. At least information on current is accumulated over a period of several milliseconds to several tens of milliseconds. The signal processing unit 19 then calculates a variation of current detected by the power supply devices 1 (step S28) and determines whether or not the variation of the current is less than a predetermined upper limit threshold (step S29). If the first power supply device 1 and the second power supply device 1 are connected in parallel, the variation is, for example, the difference between the current detected by the first power supply device 1 and the current calculated by the second power supply device 1. Alternatively, the difference between the moving average values of the current calculated by the first power supply device 1 and the current calculated by the second power supply device 1 may be calculated as the variation. If three or more power supply devices 1 are connected in parallel, the variation may be represented by standard deviation of the current detected by each power supply device 1, the difference between the maximum value and the minimum value of the current and the difference between the average value and the maximum value of the current, or the like.

Note that the signal processing unit 19 that performs the processing at step S28 corresponds to a difference calculation unit while the signal processing unit 19 that performs the processing at step S29 corresponds to an upper limit comparison unit.

If determining that current is less than the threshold (step S25: YES), determining that abnormality occurs in the second power supply device 1 (step S26: YES), or determining that the variation in current is equal to or more than the upper limit threshold (step 29: NO), the signal processing unit 19 stops the operation of the inverter 13 and the calculation of the PWM control information to thereby stop the output to the load 2 (step S30). The signal processing unit 19 further notifies the main control unit 18 of an abnormal state, and the main control unit 18 causes the operation panel 10 to display that abnormality occurs in the power supply (step S31) and ends the processing.

If determining that the variation in current is less than the upper limit threshold (step S29: YES), the main control unit 18 adds the current obtained by detection in its own device and the current indicated by the current information received from the second power supply device 1 (step S32). The signal processing unit 19 then calculates PWM control information based on the current obtained by the addition at step S32 and the voltage detected by its own device (step S33). The PWM control information calculated here is based on the current and voltage output from the overall power supply system to the load 2 and is information capable of controlling the output from the overall power supply system. Furthermore, the PWM control information calculated by the processing at step S33 is information basically common to the power supply devices 1, but the PWM control information is corrected depending on the variation of the current actually output from the power supply devices 1 to the load 2. More specifically, the PWM control information is corrected such that current output from the power supply devices 1 to the load 2 is equalized. The details of the correction of the PWM control information will be described later.

Subsequently, the main control unit 18 displays the current value calculated at step S32 at the current display portion 10a and displays the voltage value detected at step S27 at the voltage display portion 10b as illustrated in FIG. 6A (step S34).

Meanwhile, the main control unit 18 transmits information for controlling the welding machine, for example, a wire feeding control signal for controlling the feeding of the welding wire 21, from the control terminal 1c to the welding machine (step S35). The wire feeding control signal is, for example, a signal for controlling the feeding velocity of the welding wire 21, the start and stop of feeding thereof and the like.

Next, the main control unit 18 determines whether or not the input of the driving instruction signal continues (step S36). If determining that no driving instruction signal is input (step S36: NO), the main control unit 18 stops the output to the load 2 by stopping the control of the inverter 13 by the signal processing unit 19 (step S37) and ends the processing. If determining that a driving instruction signal is input (step S36: YES), the main control unit 18 returns the processing to step S13 and continues to control the power feeding to the load 2.

Figure 7:
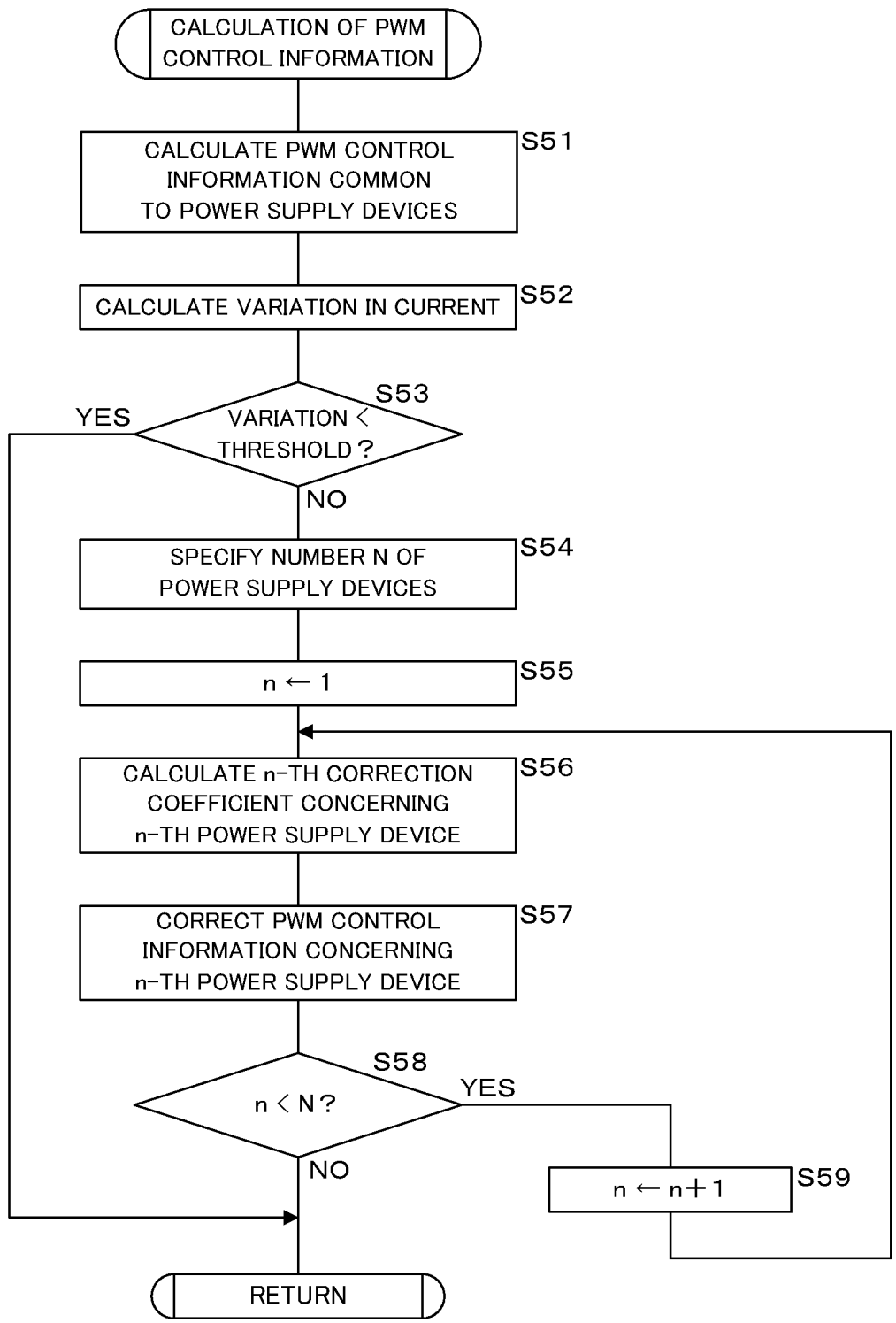
FIG. 7 is a flowchart illustrating the processing procedure concerning calculation and correction of PWM control information.

FIG. 7 is a flowchart illustrating the processing procedure concerning the calculation and correction of PWM control information. The signal processing unit 19 then calculates the PWM control information common to the power supply devices 1 assuming that another power supply device 1 other than the first power supply device 1 has a characteristic the same as that of the first power supply device 1 based on the current obtained by the above-mentioned addition at step S32 and the voltage detected by its own device (step S51).

Next, the signal processing unit 19 calculates a variation in current detected by the power supply devices 1 (step S52) and determines whether or not the variation in current is less than a predetermined threshold (step S53). The variation calculated at step S52 is the same as that calculated at step S28. If determining that the variation in current is less than the predetermined threshold (step S53: YES), the signal processing unit 19 ends the subroutine processing without correcting the PWM control information and returns the processing to step S34.

Note that the signal processing unit 19 that executes the processing at step S52 corresponds to a difference calculation unit while the signal processing unit 19 that executes the processing at step S53 corresponds to a comparison unit.

If determining that the variation in current is equal to or more than the threshold (step S53: NO), the signal processing unit 19 specifies the number N of power supply devices 1 connected in parallel (step S54). Then, 1 is substituted for the variable n representing each of the power supply devices 1 connected in parallel (step S55). It is assumed here that the value of the variable representing the power supply device 1 operating in the master power supply mode is 1 and the value of the variable representing the power supply device 1 operating in the slave power supply mode is 2 or more. If the first power supply device 1 and the second power supply device 1 are connected in parallel, the first power supply device 1 is represented by the variable n=1 while the second power supply device is represented by the variable n=2.

Subsequently, the signal processing unit 19 calculates an n-th correction coefficient for correcting the PWM control information of an n-th power supply device 1 (step S56). The PWM control information corrected here is, for example, a duty ratio, and an n-th correction coefficient is represented by the following formula (3). Note that a constant G defines the relation between the variation in current and the corrected amount of the duty ratio.

$$Pn = 1 + G \times (\Sigma I - N \times In) / \{(N-1) \times \Sigma I\} \quad (3)$$

where
N denotes the number of power supply devices 1 connected in parallel;
n denotes a variable representing a power supply device 1;
Pn denotes an n-th correction coefficient;
In=I1, I2, . . . IN denotes current detected by each of the power supply devices 1;
ΣI=I0+I1+ . . . +IN denotes the total sum of the current detected by the power supply devices 1; and
G denotes a constant.

Note that the current I1, I2, . . . IN detected by each of the power supply devices 1 may be one detection value or a moving average of the current detected multiple times over a predetermine time period for each power supply device 1. For example, if obtaining and accumulating current of each of the power supply devices 1 at a cycle of several tens of microseconds, the signal processing unit 19 may calculate the moving average of the current of each of the power supply devices 1 by using current values accumulated over several milliseconds to several tens of milliseconds and may calculate the n-th correction coefficient by using the moving average of the current.

The above-mentioned formula (3) is one example of the calculation formula of an n-th correction coefficient. Any formula may be employed if it is possible to calculate a coefficient capable of correcting the PWM control information such that current output from the power supply devices 1 is equalized. For example, the n-th correction coefficient represented by the above-mentioned formula (3) is a coefficient increasing or decreasing in proportion to the difference of the current output from the power supply devices 1, but it may be a coefficient increasing or decreasing nonlinearly. Furthermore, the n-th correction coefficient may be a coefficient increasing or decreasing in proportion to the time integration, time derivative or the like of the above-described difference.

Note that if two power supply devices 1 are connected in parallel, the above-mentioned formula (3) is represented by formulas (4) and (5) below.

$$P1 = 1 + G \times (I2 - I1) / (I1 + I2) \quad (4)$$

$$P2 = 1 + G \times (I1 - I2) / (I1 + I2) \quad (5)$$

The signal processing unit 19 then multiplies the duty ratio concerning the power supply device 1 corresponding to the variable n by the n-th correction coefficient to thereby correct the PWM control information (step S57).

Subsequently, the signal processing unit 19 determines whether or not the variable n is less than the number N of power supply devices 1 connected in parallel (step S58). If determining that the variable n is less than N (step S58: YES), the signal processing unit 19 adds 1 to the variable n (step S59) and returns the processing to step S56. If determining that the variable n is equal to or more than N (step S58: NO), the signal processing unit 19 ends the subroutine processing without correcting the PWM control information and returns the processing to step S34.

Note that the signal processing unit 19 that executes the processing at step S51 corresponds to a calculation unit while the signal processing unit 19 that executes the processing from steps S56 to S59 corresponds to a first correction unit and a second correction unit.

In the power supply system thus configured, the first power supply device 1 serving as a master power supply obtains current information from the second power supply device 1 serving as a slave power supply and calculates PWM control information for controlling the output from each of the power supply devices 1. In addition, the first power supply device 1 corrects the PWM control information of the power supply devices 1 such that the current output from the first power supply device 1 to the load 2 and the current output from the second power supply device 1 to the load 2 are equalized. The first power supply device 1 then controls the output based on the corrected PWM control information for its own device and transmits the corrected PWM control information to the second power supply device 1, and this power supply device 1 serving as a slave power supply controls the output based on the PWM control information calculated and corrected on the master power supply side. Accordingly, in the power supply system according to the present embodiment, even as for the welding widely varying in the magnitude of the load 2 in a very short time period, the power supply devices 1 may be synchronized in operation, the response as high as a single power supply may be achieved, and the outputs from the power supply devices 1 may be stably controlled. Moreover, current may be stably controlled such that current output from the power supply devices 1 to the load 2 is equalized.

Furthermore, since the first power supply device 1 is configured to correct the PWM control information only when current output from the power supply devices 1 to the load 2 varies widely, current may stably be controlled such that current from the power supply devices 1 is equalized while the time variation of the current output from the power supply devices 1 to the load 2 is reduced.

Moreover, in the case where the variation in current output from the power supply devices 1 is equal to or more than the upper limit threshold, the overall power supply system may be stopped to thereby ensure safety. For example, in the case where abnormality occurs that is uncontrollable by the balance control of the current such as a disconnected state of the power cable or the like, safety concerning the power supply system may be ensured.

Additionally, the power supply device 1 may correct the PWM control information such that the variation in current output from the power supply device 1 is made small with simple processing of multiplying the duty ratio of the PWM control information for controlling the operation of each of the power supply devices 1 by the correction coefficient.

Furthermore, the user may confirm the information about the current and voltage that are being output from the power supply system to the load 2 by using the current display portion 10a and the voltage display portion 10b of the first power supply device 1 operating as a master power supply.

In addition, the user may be free from unnecessary confusion by displaying predetermined information on the current display portion 10a and the voltage display portion 10b of the second power supply device 1 operating as a slave power supply.

Moreover, in the case where the first power supply device 1 serving as a master power supply cannot receive the current information that is to be transmitted from the slave power supply, it stops the entire power system regarding that abnormality occurs in the communication with the second power supply device 1 serving as a slave power supply to thereby ensure safety.

Furthermore, in the case where the current output from the second power supply device 1 serving as a slave power supply is less than a threshold though the first power supply device 1 serving as a master power supply outputs current from its own device, the first power supply device 1 stops the entire power supply system regarding that abnormality occurs in the second power supply device 1, so that the safety is ensured.

Additionally, if abnormality occurs in the operating state of the second power supply device 1 serving as a slave power supply, the first power supply device 1 serving as a master power supply stops the entire power supply system, so that the safety is ensured.

In addition, by stopping the power supply system upon these abnormalities, the power supply system may be maintained.

Moreover, the power supply device 1 according to the present embodiment may function as either one of the master power supply and the slave power supply by operating the operation portion 10c. Thus, even if the master power supply that constitutes the power supply system fails, the operating mode of the power supply device 1 functioning as a slave power supply is switched to the master power supply mode to thereby enable easy reconstruction of the power supply system.

Furthermore, the power supply device 1 according to the present embodiment may also function as a single power supply by operating the operation portion 10c.

While an example of the two power supply devices 1 connected in parallel to the common load 2 is mainly described in the present embodiment, three or more power supply devices 1 may also be used to form a power supply system.

Additionally, described is an example that the load 2 is used for a load concerning arc welding, but it may also be used for a power supply system for supplying power to a load concerning an arc disconnection and other loads requiring large current.

In addition, the power supply system according to the present embodiment may output large current to an arc welding machine.

While description is made on the example that an isolation transformer typed switching power supply is subject to PWM control in the present embodiment, the configuration and the control system of the power supply device 1 need not to be limited to particular ones, and known configuration and control system may be used. The known control system includes a pulse frequency modulation system as well as a pulse width modulation system, for example.

Furthermore, in the present embodiment, description is made on the case where the entire power supply system is stopped if abnormality occurs in the power supply device 1 operating as a slave power supply. Such a configuration may, however, be made that power supply to the load 2 is continued if abnormality is trivial for the entire power supply system. For example, in the case where multiple slave power supplies are connected in parallel, and a disconnection relay or the like for disconnecting the power supply device 1 for which abnormality is found from the power supply system is provided, if required electric power may be supplied from the rest of the power supply devices 1, such multiple power supply devices 1 normally operating may continuously be operated.

(Modification)

Figure 8:
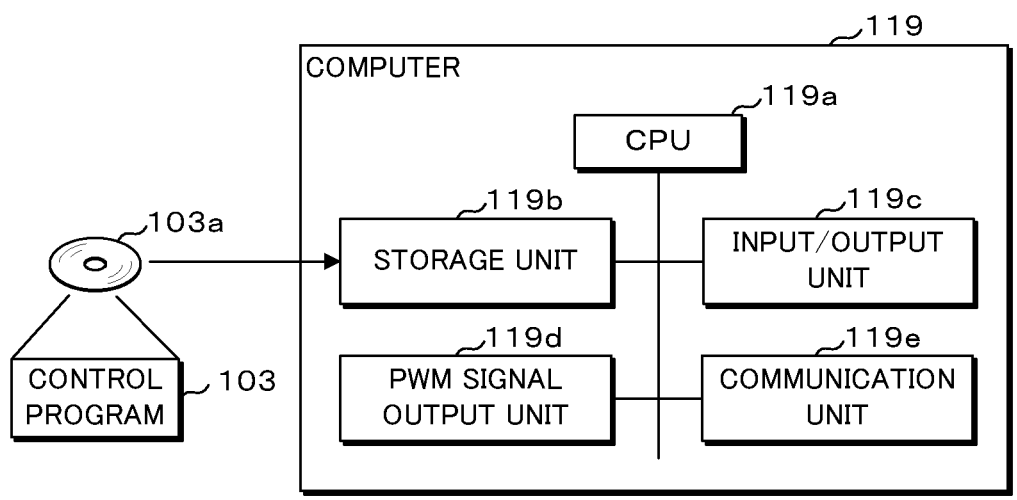
FIG. 8 is a block diagram illustrating one example of the configuration of a signal processing circuit according to a modification.

FIG. 8 is a block diagram illustrating one example of the configuration of a signal processing circuit according to a modification. Since the power supply device 1 according to the modification is different from that of the embodiment in the configuration of the signal processing unit 119, the difference will mainly be described below. The modification is similar to the embodiment in the configuration and effects, and thus the detailed description will not be made while applying similar reference symbols to the corresponding parts. While described in the above-mentioned embodiment is an example that the calculation and correction of the PWM control information is performed hardware-wise by the DSP that is a dedicated circuit, described below is an example that the calculation and correction of the PWM control information is performed software-wise.

The signal processing unit 119 is a computer having a CPU 119a, for example, and the CPU 119a is connected to a storage unit 119b, an input/output unit 119c, a PWM signal output unit 119d and a communication unit 119e via a bus. The CPU 119a of the signal processing unit 119 calculates and corrects the PWM control information by executing a control program 103, which will be described below, stored in the storage unit 119b to thereby execute processing for controlling the operation of each of the power supply devices 1.

The storage unit 119b includes a volatile memory such as a RAM or the like and a nonvolatile memory such as an electrically erasable programmable (EEP) ROM, a flash memory or the like. The storage unit 119b stores the control program 103 for executing control concerning calculation and correction of the PWM control information to control the current and voltage to be output from each of the power supply devices 1. It is noted that the control program 103 may be computer-readably recorded in a recording medium 103a. The storage unit 119b stores the control program 103 read out from the recording medium 103a by a reading device (not illustrated). The recording medium 103a is an optical disk such as a compact disc (CD)-ROM, a digital versatile disc (DVD)-ROM, a blue-ray (registered trademark) disc (BD) or the like, a magnetic disk such as a flexible disk, a hard disk or the like, a magneto optical disk, a semiconductor memory and so on. Furthermore, the control program 103 concerning Embodiment 1 may be downloaded from an external computer (not illustrated) connected to a communication network (not illustrated) and may be stored in the storage unit 119b.

The input/output unit 119c is connected to the main control unit 18, and the CPU 119a inputs and outputs various signals via the input/output unit 119c.

The communication unit 119e is a communication circuit for transmitting and receiving various types of information to and from another power supply device 1, and the CPU 119a transmits and receives various types of information to and from another power supply device 1 via the communication unit 119e.

The PWM signal output unit 119d is connected to the inverter 13, and the CPU 119a outputs a PWM signal to the inverter 13 via the PWM signal output unit 119d according to the calculated and corrected PWM control signal.

The details of the processing performed by the signal processing unit 119 executing the control program 103 are similar to those depicted in FIGS. 4, 5 and 7 in the above-mentioned embodiments.

Even in the power supply system according to the modification thus configured, an effect similar to the power supply system described in the above-described embodiment may be exhibited.

It is to be noted that, as used herein and in the appended claims, the singular forms "a", "an", and "the" include plural referents unless the context clearly dictates otherwise.

It is to be understood that the embodiments disclosed here are illustrative in all respects and not restrictive. The scope of the present invention is defined by the appended claims, and all changes that fall within the meanings and the bounds of the claims, or equivalence of such meanings and bounds are intended to be embraced by the claims.

The invention claimed is:

1. A power supply system comprising a plurality of power supply apparatuses including a first power supply apparatus and a second power supply apparatus, the plurality of power supply apparatuses being connected in parallel to a common load, wherein
the first power supply apparatus comprises a processor, a communication circuit, a current detector, and a voltage detector, the processor of the first power supply apparatus being configured to:
calculate control information for controlling voltage or current to be output to the load,
control voltage or current to be output to the load based on the control information, and
transmit the control information to the second power supply apparatus by the communication circuit of the first power supply apparatus, wherein
the second power supply apparatus comprises a processor, a communication circuit, and a current detector, the processor of the second power supply apparatus being configured to:
receive the control information transmitted from the communication circuit of the first power supply apparatus,
control voltage or current to be output to the load based on the control information received by the communication circuit of the second power supply apparatus,
detect current output from the second power supply apparatus to the load by the current detector of the second power supply apparatus, and
transmit current information indicative of the current detected by the current detector of the second power supply apparatus to the first power supply apparatus by the communication circuit of the second power supply device, wherein
the processor of the first power supply apparatus is further configured to:
receive the current information transmitted from the communication circuit of the second power supply device,
detect current output from the first power supply apparatus to the load by the current detector of the first power supply apparatus,
detect voltage output from the first power supply apparatus to the load by the voltage detector,
calculate control information for controlling voltage or current to be output to the load based on the current indicated by the current information received by the communication circuit of the first power supply apparatus, the current detected by the current detector included in the first power supply apparatus and the voltage detected by the voltage detector,
correct the control information concerning the first power supply apparatus such that current to be output from the first power supply apparatus to the load and current to be output from the second power supply apparatus to the load are equalized based on the current indicated by the current information received by the communication circuit of the first power supply apparatus and the current detected by the current detector included in the first power supply apparatus, and
correct the control information concerning the second power supply apparatus such that current to be output from the first power supply apparatus to the load and current to be output from the second power supply apparatus to the load are equalized based on the current indicated by the current information received by the communication circuit of the first power supply apparatus and the current detected by the current detector included in the first power supply apparatus, wherein
the control information calculated by the processor of the first power supply apparatus includes a control value to increase or reduce current to be output to the load, and
the processor of the first power supply apparatus corrects the control value of the control information according to a ratio of a current difference to a total current, the current difference being a difference between the current indicated by the current information received by the communication circuit of the first power supply apparatus and the current detected by the current detector of the first power supply apparatus, and the total current being a sum of the current indicated by the current information received by the communication circuit of the first power supply apparatus and the current detected by the current detector of the first power supply apparatus.

2. The power supply system according to claim 1, wherein the processor of the first power supply apparatus is further configured to:
calculate a difference between the current indicated by the current information received by the communication circuit of the first power supply apparatus and the current detected by the current detector included in the first power supply device;
compare the difference and a threshold; and
correct the control information if the difference is equal to or more than the threshold.

3. The power supply system according to claim 1, wherein the processor of the first power supply apparatus is further configured to:
calculate a difference between the current indicated by the current information received by the communication circuit of the first power supply apparatus and the current detected by the current detector included in the first power supply device; and
compare the difference and an upper limit threshold,
wherein one of the power supply apparatuses stops operation if the difference is equal to or more than the upper limit threshold.

4. The power supply system according to any one of claims 1 to 3, wherein the processor of the first power supply device is configured to:
correct the control information by multiplying the control value included in the control information by a correction coefficient represented by a formula (1) below, and
correct the control information by multiplying the control value included in the control information by a correction coefficient represented by a formula (2) below, $$P1=1+G\times(I2-I1)/(I1+I2) \qquad (1) \text{ and}$$

$$P2=1+G\times(I1-I2)/(I1+I2) \qquad (2),$$

wherein
P1 and P2: correction coefficients,
I1: current detected by the first power supply device,
I2: current detected by the second power supply device, and
G: a constant.

5. The power supply system according to claim 1, wherein the plurality of power supply apparatus supply power to a load concerning arc welding.

6. A power supply apparatus outputting voltage and current to a load, comprising:
   a current detector that detects current output to the load;
   a voltage detector that detects voltage output to the load;
   a communication circuit;
   a processor configured to:
   receive current information indicative of current output from a different power supply apparatus to the load;
   calculate control information for controlling voltage or current to be output to the load based on the current indicated by the current information received by the communication circuit, the current detected by the current detector and the voltage detected by the voltage detector;
   correct the control information concerning the power supply apparatus such that current output from the power supply apparatus to the load and the current output from the different power supply apparatus to the load are equalized based on the current indicated by the current information received by the communication circuit and the current detected by the current detector;
   correct the control information concerning the different power supply apparatus such that current output from the power supply apparatus to the load and the current output from the different power supply apparatus to the load are equalized based on the current indicated by the current information received by the communication circuit and the current detected by the current detector;
   control voltage or current to be output to the load based on the control information corrected by the processor; and
   transmit the control information corrected by the processor to the different power supply apparatus,
   wherein
   the control information calculated by the processor includes a control value to increase or reduce current to be output to the load, and the processor corrects the control value of the control information according to a ratio of a current difference to a total current, the current difference being a difference between the current indicated by the current information received by the communication circuit and the current detected by the current detector, and the total current being a sum of the current indicated by the current information received by the communication circuit and the current detected by the current detector.

7. A control method of a power supply system comprising a plurality of power supply apparatuses including a first power supply apparatus and a second power supply apparatus, the plurality of power supply apparatuses connected in parallel to a common load, comprising:
   detecting current output from the first power supply apparatus and current output from the second power supply apparatus to the load, and voltage output from the first power supply apparatus to the load;
   calculating control information for controlling voltage or current to be output to the load from each of the power supply apparatuses based on each detected current and detected voltage;
   correcting control information concerning the first power supply apparatus and control information concerning the second power supply apparatus such that current to be output from the first power supply apparatus to the load and current to be output from the second power supply apparatus to the load are equalized based on each detected current; and
   controlling voltage or current to be output from the first power supply apparatus and the second power supply apparatus to the load based on the corrected control information,
   wherein
   the control information includes a control value to increase or reduce current to be output to the load, and
   the control value of the control information is corrected according to a ratio of a current difference to a total current, the current difference being a difference between the detected current output from the first power supply apparatus and the detected current output from the second power supply apparatus, and the total current being a sum of the detected current output from the first power supply apparatus and the detected current output from the second power supply apparatus.

* * * * *